(12) United States Patent  
Miyazaki

(10) Patent No.: US 7,969,169 B2  
(45) Date of Patent: Jun. 28, 2011

(54) SEMICONDUCTOR INTEGRATED CIRCUIT WAFER, SEMICONDUCTOR INTEGRATED CIRCUIT CHIP, AND METHOD OF TESTING SEMICONDUCTOR INTEGRATED CIRCUIT WAFER

(75) Inventor: Manabu Miyazaki, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 288 days.

(21) Appl. No.: 12/416,513

(22) Filed: Apr. 1, 2009

(65) Prior Publication Data

US 2009/0251160 A1 Oct. 8, 2009

(30) Foreign Application Priority Data

Apr. 7, 2008 (JP) ................ 2008-099664

(51) Int. Cl.  
*G01R 31/26* (2006.01)

(52) U.S. Cl. ............ 324/750.3; 324/762.01; 324/762.03

(58) Field of Classification Search ................ None  
See application file for complete search history.

(56) References Cited

U.S. PATENT DOCUMENTS

| | | | |
|---|---|---|---|
| 5,929,650 A * | 7/1999 | Pappert et al. ............ | 324/750.3 |
| 7,057,409 B2 * | 6/2006 | Wills ........................ | 324/750.3 |

FOREIGN PATENT DOCUMENTS

| | | |
|---|---|---|
| JP | 2001-085479 A | 3/2001 |
| JP | 2002-176140 A | 6/2002 |
| JP | 2003-124275 A | 4/2003 |

* cited by examiner

*Primary Examiner* — Vinh P Nguyen  
(74) *Attorney, Agent, or Firm* — Sughrue Mion, PLLC

(57) ABSTRACT

A semiconductor integrated circuit wafer includes: a plurality of semiconductor integrated circuit regions each of which includes a semiconductor integrated circuit formed thereon; a scribe region which separates the semiconductor integrated circuit regions adjacent to each other; a build in self test (BIST) circuit which is provided in the scribe region and inspects the semiconductor integrated circuit; a connection wiring which is formed ranging from the scribe region to the semiconductor integrated circuit region and connects the semiconductor integrated circuit and the BIST circuit; a BIST switching signal input pad which is provided in the semiconductor integrated circuit region; and a BIST switching circuit which is provided in the semiconductor integrated circuit region and is driven by a driving signal input from the BIST switching signal input pad, the BIST switching circuit including: an input-output pad which connects with the semiconductor integrated circuit; a circuit wiring which connects the input-output pad with the semiconductor integrated circuit; and a switch element which is provided at a middle position of the circuit wiring and is driven by the driving signal input from the BIST switching signal input pad.

4 Claims, 2 Drawing Sheets

SEMICONDUCTOR INTEGRATED CIRCUIT WAFER, SEMICONDUCTOR INTEGRATED CIRCUIT CHIP, AND METHOD OF TESTING SEMICONDUCTOR INTEGRATED CIRCUIT WAFER

BACKGROUND OF THE INVENTION

1. Field of the Invention

The present invention relates to a semiconductor integrated circuit wafer, a semiconductor integrated circuit chip, and a method of testing a semiconductor integrated circuit wafer which are suitable for detecting defects of the semiconductor integrated circuit by using a build in self test (BIST) circuit.

Priority is claimed on Japanese Patent Application No. 2008-099664, filed Apr. 7, 2008, the content of which is incorporated herein by reference.

2. Description of Related Art

In a test of a semiconductor integrated circuit wafer, probe pins (exploring needles) contact with input-output pads (external electrodes) in the semiconductor integrated circuit such as a memory, and input test pattern signals which are supplied from a tester via the probe pins, and thus electrical characteristics can be measured to determine whether or not the semiconductor integrated circuit wafer is defective. When the probe pins contact with the input-output pads, there may be scars caused by contacting the input-output pad to the probe pins. If the scars occur in the input-output pads, when wires are bonded to the input-output pads or bumps are constructed, the scars lead to an increase in defects and to a decrease in reliability of connection. For this reason, it is necessary to improve the structure of the input-output pad or the adjustment of contact pressure of the probe pins in order to make it possible to safely test by reducing the scars.

On the other hand, there is a method of using a built in self test (BIST) circuit as a technique of efficiently testing the semiconductor integrated circuit. However, when the BIST circuit is built in a circuit region of the semiconductor integrated circuit, the chip size of the entire semiconductor integrated circuit is increased, and thus the chip cost rises. In addition, unnecessary BIST circuit portions remain after production is complete. Thereby the consumption power increases.

In order to solve the problems of increase in the chip size or increase in the consumption power, there is proposed a structure in which the BIST circuit and the pads for testing are provided in a scribe region (for example, refer to Japanese Unexamined Patent Application, First Publication, No. 2002-176140). In this related art, there is a need for the probe pins coming into contact with both the pads for testing the BIST circuit in the scribe region and the input-output pads of a semiconductor integrated circuit region in order to be electrically connected with each other via the probe pins as a transmission path. For this reason, there are problems in that (i) the number of the probe pins is increased, so that a testing tool (probe card) is complicated and the cost is increased; and (ii) the electrical characteristics of the testing tool affects the test of the semiconductor integrated circuit.

In addition, there is proposed another structure in that the BIST circuit and the pads for testing are provided in the scribe region, which are electrically connected with the input-output pads in the semiconductor integrated circuit region by wiring (for example, refer to Japanese Unexamined Patent Application, First Publication, No. 2003-124275). In this related art, when the semiconductor chips are individually separated, the scribe region and the wiring for connection are also separated at the same time. However, due to a finished state of the cut surface, there may be an electrical defect such as a short circuit or the like between the wiring for connection.

In addition, there is disclosed a technique of forming wiring for connecting a testing circuit and a functional circuit, and switch elements for electrically separating the wiring (for example, refer to Japanese Unexamined Patent Application, First Publication, No. 2001-085479). In this related art, there is no description about the pads of the testing circuit (BIST circuit) and the functional circuit (semiconductor integrated circuit) and effects thereof, and there is no suggestion of a method which improves the scars of the input-output pads that should be solved.

SUMMARY

The present invention seeks to solve one or more of the above problems, or to improve those problems at least in part.

In one embodiment, there is provided a semiconductor integrated circuit wafer that includes: a plurality of semiconductor integrated circuit regions each of which includes a semiconductor integrated circuit formed thereon; a scribe region which separates the semiconductor integrated circuit regions adjacent to each other; a build in self test (BIST) circuit which is provided in the scribe region and inspects the semiconductor integrated circuit; a connection wiring which is formed ranging from the scribe region to the semiconductor integrated circuit region and connects the semiconductor integrated circuit and the BIST circuit; a BIST switching signal input pad which is provided in the semiconductor integrated circuit region; and a BIST switching circuit which is provided in the semiconductor integrated circuit region and is driven by a driving signal input from the BIST switching signal input pad, the BIST switching circuit including: an input-output pad which connects with the semiconductor integrated circuit through a circuit wiring; and a switch element which is provided at a middle position of the circuit wiring and is driven by the driving signal input from the BIST switching signal input pad.

In another embodiment, there is provided a semiconductor integrated circuit chip which is obtained by dividing a semiconductor integrated circuit wafer along a scribe region. The semiconductor integrated circuit chip includes: a semiconductor integrated circuit; a build in self test (BIST) switching signal input pad; and a BIST switching circuit which is driven by a driving signal input from the BIST switching signal input pad, the BIST switching circuit including: an input-output pad which connects with the semiconductor integrated circuit through a circuit wiring; and a switch element which is provided at a middle position of the circuit wiring and is driven by the driving signal input from the BIST switching signal input pad.

In another embodiment, there is provided a method of testing a semiconductor integrated circuit included in a semiconductor integrated circuit wafer, the semiconductor integrated circuit wafer including: a plurality of semiconductor integrated circuit regions each formed with the semiconductor integrated circuit; a scribe region which separates the semiconductor integrated circuit regions adjacent to each other; a build in self test (BIST) circuit which is provided in the scribe region; a connection wiring which connects the semiconductor integrated circuit and the BIST circuit; a BIST switching signal input pad which is provided in the semiconductor integrated circuit region, the BIST switching circuit including an input-output pad which connects with the semiconductor integrated circuit through a circuit wiring, and a switch element which is provided at a middle position of the circuit wiring, the method comprising: connecting a probe pin of a probe card with the BIST circuit and the BIST switching signal input pad; inputting a driving signal to the BIST switching signal input pad to turn on the switch element in the BIST switching circuit so as to disconnect the circuit wiring and connect the BIST circuit with the semiconductor integrated circuit via the connection wiring; inputting an information signal to the BIST circuit via the probe pin from a tester; and inputting the input information signal to the semiconductor integrated circuit via the connection wiring to inspect the semiconductor integrated circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated here for explanatory purposes.

Figure 1:
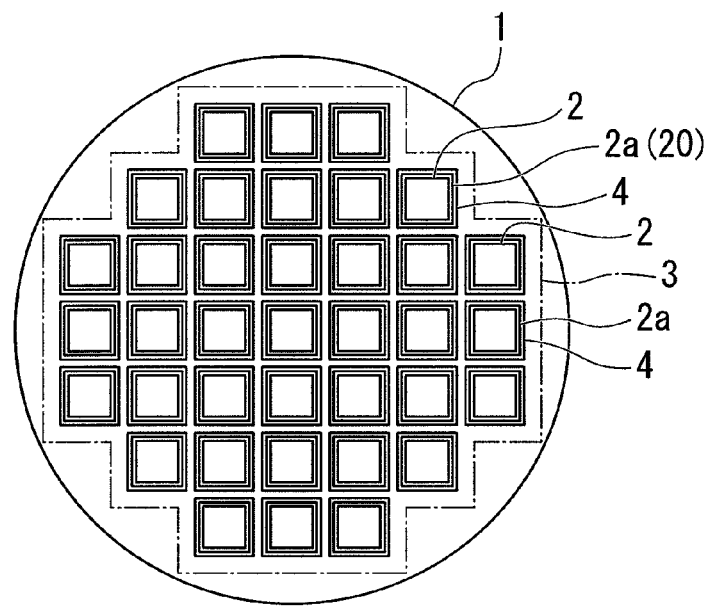
FIG. 1 is a schematic plan-view that shows a semiconductor integrated circuit wafer according to an embodiment of the present invention.
Figure 2:
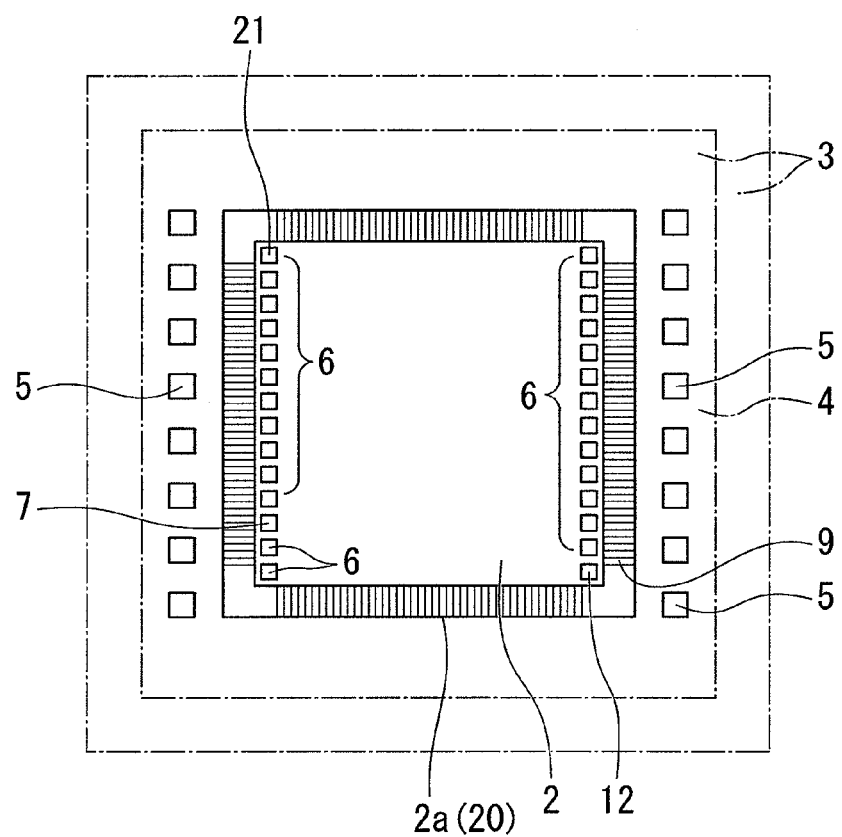
FIG. 2 is a schematic plan-view that shows a magnified main portion of the semiconductor integrated circuit wafer according to the embodiment of the present invention.
Figure 3:
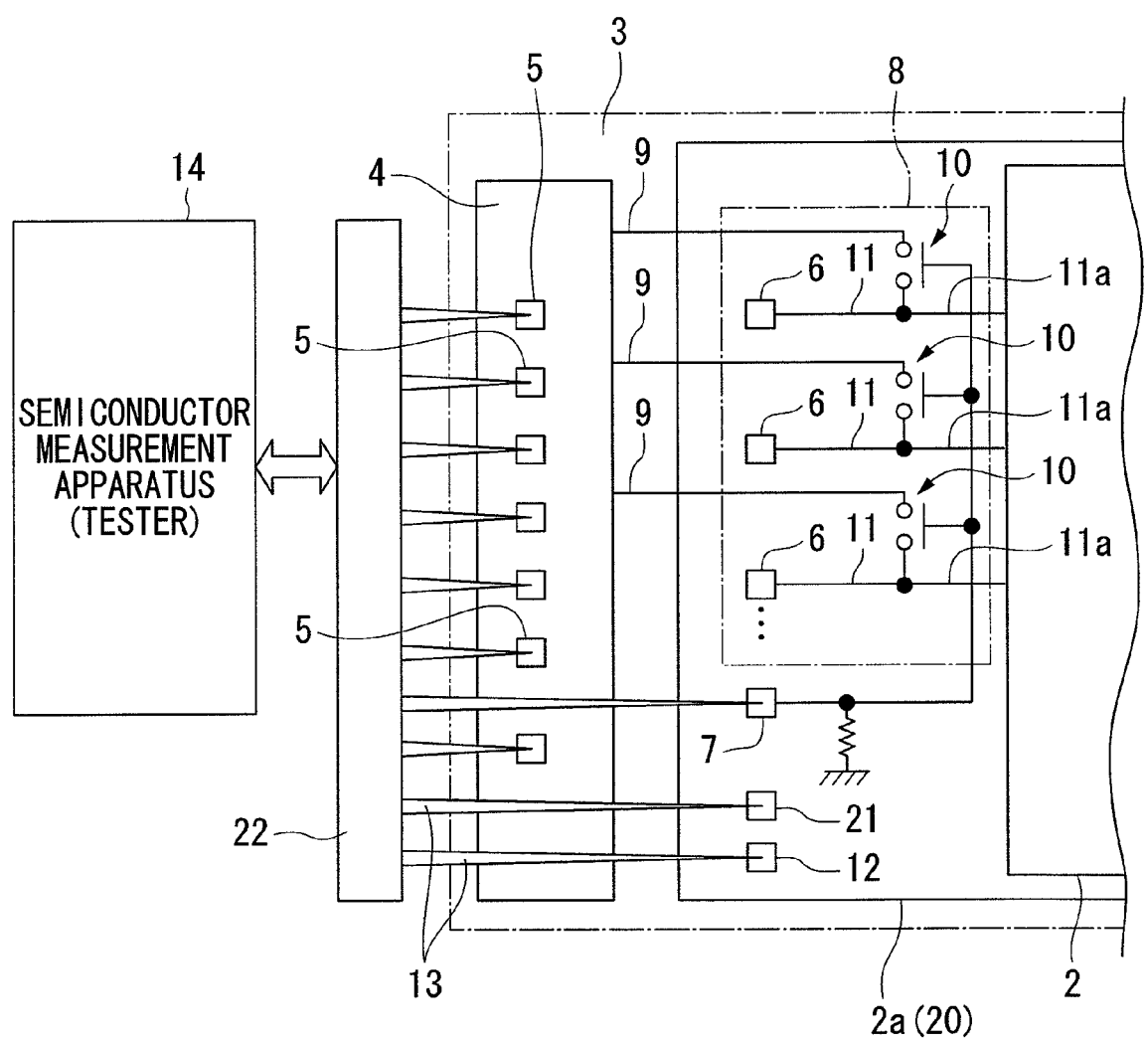
FIG. 3 is a circuit diagram that shows a circuit configuration of the semiconductor integrated circuit wafer and a method of testing the semiconductor integrated circuit according to the embodiment of the present invention.

A first embodiment of the present invention will be described hereinbelow with reference to the drawings. FIG. 1 is a plan view schematically illustrating a semiconductor integrated circuit wafer according to the present embodiment of the present invention. FIG. 2 is an enlarged view illustrating a part of FIG. 1, and a plan view schematically illustrating a main portion of the semiconductor integrated circuit wafer according to the present embodiment of the present invention. FIG. 3 is a view schematically illustrating a circuit configuration of the semiconductor integrated circuit wafer and a method of testing the semiconductor integrated circuit according to the present embodiment of the present invention.

As shown in FIGS. 1 and 2, in the semiconductor integrated circuit wafer 1 of the present embodiment, a BIST circuit 4, which includes BIST circuit pads 5 used for testing a semiconductor integrated circuit 2, is provided in a scribe region 3 on the wafer 1. Further, connection wiring 9, which are used for electrically connecting the BIST circuit 4 in the scribe region 3 and the semiconductor integrated circuit 2, are formed so as to be extended from a semiconductor integrated circuit region 2a to the scribe region 3. A BIST switching signal input pad 7 is provided in the semiconductor integrated circuit region 2a, and a BIST switching circuit 8 is driven by a driving signal from the BIST switching signal input pad 7, so that switch elements 10 are electrically turned on. Therefore, the semiconductor integrated circuit 2 is connected with the BIST circuit 4.

When the semiconductor integrated circuit 2 is tested by using the BIST circuit 4, probe pins 13 come into contact with the BIST circuit pads 5 of the BIST circuit 4 which is formed in the scribe region 3 and the BIST switching signal input pad 7 in the semiconductor integrated circuit region 2a, and thus the semiconductor integrated circuit 2 is electrically connected with a semiconductor measurement apparatus 14 (tester) via a probe card 22. Therefore, the BIST circuit 4 is driven by the signal from the tester 14, so that testing of the semiconductor integrated circuit 2 is performed. In testing, the probe pins 13 come into contact with the BIST switching signal input pad 7 and further with a power source pad 21 and a ground (GND) pad 12 in the semiconductor integrated circuit region 2a, and thus the semiconductor integrated circuit 2 is electrically connected with the tester 14 via the probe card 22. Therefore, the BIST circuit 4 is driven by information signals for testing from the tester 14, so that testing of the semiconductor integrated circuit 2 is performed.

Hereinafter, the embodiment will be set forth with reference to the accompanying drawings.

As shown in FIGS. 1 and 2, a plurality of semiconductor integrated circuit regions 2a is disposed in a matrix shape in the semiconductor integrated circuit wafer 1. The semiconductor integrated circuit 2 is formed in the semiconductor integrated circuit region 2a. In the vicinity of each semiconductor integrated circuit region 2a, the scribe region 3 is provided to individually separate adjacent semiconductor integrated circuit regions 2a. The BIST circuit 4 is provided in the scribe region 3. The BIST circuit pads 5 used for inputting the information signals for testing to the BIST circuit 4 are provided in the BIST circuit 4. In addition, a plurality of the BIST circuits 4 may be formed for each kind of function. In addition, the semiconductor integrated circuit 2 may be a memory such as a dynamic random access memory (DRAM) or a static random access memory (SRAM), or a logic circuit. In the present embodiment, an example where a memory circuit is used as the semiconductor integrated circuit 2 will be described.

In the vicinity of the semiconductor integrated circuit 2 in the semiconductor integrated circuit region 2a, the power source (VDD) pad 21, the GND pad 12, a plurality of input-output pads 6, and the BIST switching signal input pad 7 are disposed. In addition, as shown in FIG. 3, the BIST switching circuit 8 is provided in the semiconductor integrated region 2a, which is driven by the driving signal from the BIST switching signal input pad 7 and is used for testing the semiconductor integrated circuit 2. The BIST circuit 4 and the BIST switching circuit 8 (refer to FIG. 3) are connected to each other by the connection wiring 9 which are formed ranging from the scribe region 3 to the semiconductor integrated circuit region 2a.

As shown in FIG. 3, the semiconductor integrated circuit 2 is connected to the input-output pads 6 by circuit wiring 11. The BIST switching circuit 8 used for testing the semiconductor integrated circuit 2 includes the input-output pads 6 that connect with the semiconductor integrated circuit 2, the circuit wiring 11 for connecting the input-output pads 6 and the semiconductor integrated circuit 2, and the switch elements 10 which are provided at the middle of the circuit wiring 11 and are driven by the driving signal from the BIST switching signal input pad 7. The switch elements 10 in the turn-off state connect the input-output pads 6 with the semiconductor integrated circuit 2 via the circuit wiring 11. On the other hand, in the turn-on state, the switch elements 10 block the circuit wiring 11 and connect the BIST circuit 4 with the semiconductor integrated circuit 2 via the connection wiring 9. An ON/OFF control of the switch elements 10 is performed by a BIST switching signal from the BIST switching signal pad 7. When the driving signal is received to the BIST switching signal input pad 7, the switch elements 10 are turned on, and the BIST circuit 4 is connected with the semiconductor integrated circuit 2.

For example, if the switch element 10 is activated by a high-level input, the switch elements 10 are turned by the high-level input and turned off by a low-level input. The switch elements 10 may include a transfer metal-oxide-semiconductor (MOS) transistor in which the BIST switching signals are pull-downed. In addition, the input-output pad 6 included in the BIST switching circuit 8 and the switch element 10 may be provided in plural pieces according to a memory array of the semiconductor integrated circuit 2. The connection between the semiconductor integrated circuit 2 and the circuit wiring 11 can be made by fuse instead of the transfer MOS transistor.

Subsequently, the method of testing the semiconductor integrated circuit will be described with reference to FIG. 3.

The probe card 22 used for testing includes a plurality of probe pins 13. The probe pins 13 come into contact with a plurality of the BIST circuit pads 5 provided in the BIST circuit 4, and the power source pad 21, the GND pad 12, and the BIST switching signal input pad 7 provided in the semiconductor integrated circuit region 2a, respectively. Therefore, the semiconductor integrated circuit 2 can be tested by the BIST signals from the BIST circuit 4 via the probe card 22 and the probe pins 13.

First, at the time of starting the testing, the probe pins 13 come into contact with the plurality of the BIST circuit pads 5, the power source pad 21 in the memory chip 20, the GND pad 12, and the BIST switching signal input pad 7, respectively.

Next, the driving signal is input to the BIST switching signal input pad 7 via the probe pin 13 from the tester 14. When a BIST switching signal (driving signal) BIST Enable is input to the BIST switching signal input pad 7, the switch elements 10 become the turn-on state. As a result, the circuit wiring 11 are blocked by the switch elements 10, and the BIST circuit 4 is connected with the semiconductor integrated circuit 2 via the connection wiring 9, the switch elements 10, and circuit wiring 1 la at the side of the semiconductor integrated circuit 2.

Next, the information signals for testing are input to the BIST circuit pads 5 via the probe pins 13 from the tester 14 in order to control the BIST circuit 4. Therefore, the information signals for testing from the BIST circuit 4 are transmitted to the semiconductor integrated circuit 2 via the connection wiring 9 and the switch elements 10, and testing of the semiconductor integrated circuit 2 is performed.

After testing for the semiconductor integrated circuit 2 is completed in a wafer state, the semiconductor integrated circuit wafer 1 is segmented along the scribe region 3. As a result, the semiconductor integrated circuit chips 20 partitioned in the semiconductor integrated circuit region 2a are separated, and at the same time, the connection wiring 9 in the scribe region 3 are cut. There may be a risk of an electrically adverse effect on the semiconductor integrated circuit 2 by a short circuit according to the state of the cut surface thereof. However, the cut surface of the connection wiring 9 is electrically isolated because the switch elements 10 are turned off by the BIST switching signal BIST Enable which is pull-downed in the semiconductor integrated circuit 2, so that the operation of the memory circuit is not affected by the state of the cut surface. In addition, since a current does not flow through the connection wiring 9 after the chip is formed, the consumption power of the semiconductor integrated circuit chip 20 can be reduced.

The semiconductor integrated circuit chip 20, which is finally formed, includes the semiconductor integrated circuit 2, the BIST switching signal input pad 7, and the BIST switching circuit 8. The BIST switching circuit 8 includes the input-output pads 6, the circuit wiring 11, the switch elements 10 which are provided at the middle of the circuit wiring 11, and connection wiring 9 which are cut.

As described above, in testing the semiconductor integrated circuit 2, there is no need for the probe pins 13 to come into contact with the input-output pads 6 of the semiconductor integrated circuit 2. Accordingly, it is possible to perform testing without any scar on the input-output pads 6.

In addition, by disposing the BIST circuit 4 in the scribe region 3, the area of the semiconductor integrated circuit region 2a is reduced in comparison with the case where the BIST circuit 4 is built in the semiconductor integrated circuit 2. Accordingly, it is possible to achieve low production cost and miniaturization in the package mounting. Further, since the BIST circuit 4 is removed together with the scribe region 3 after the semiconductor integrated circuit chips 20 are made, it is possible to prevent unnecessary consumption current caused by the BIST circuit 4.

In addition, by constructing the connection wiring 9 on the wafer 1, degradation in signal is reduced and high-speed testing is possible in comparison with the method in which the signal is transmitted via the probe card in the related art. Further, with the configuration of the BIST circuit 4, the number of the BIST circuit pads 5 can be reduced. In addition, the number of the probe pins can be reduced, and it is possible to suppress the cost of the testing tool (probe card). Moreover, it is possible to prevent the defect of a short circuit on the cut surface which is caused by the wiring connection manner.

In addition, since the number of pads which are damaged by the probe pins 13 among the input-output pads 6 used for assembling the semiconductor integrated circuit 2 is suppressed at the minimum (in the operation example described above, corresponding to only 3 pads, namely, the power source pad 21, the GND pad 12, and the BIST switching signal input pad 7), it is possible to reduce defects in bonding and increase reliability of connection in bonding.

Further, in the above-mentioned testing method, the BIST switching signal input pad 7, the power source pad 21, and the GND pad 12 in the semiconductor integrated circuit 2 are needed to come into contact with the probe pins 13. However, this is not limited to these 3 terminals, and the number of pads which are needed to come into contact with the probe pins 13 may be arbitrarily increased or decreased. In addition, by disposing only 3 terminals by two sets in parallel, scars of the 3 terminals can be surely removed, and it is possible to suppress increase in chip size for the high-level inputs.

According to the present invention, it is possible to provide a semiconductor integrated circuit wafer and a method of testing a semiconductor integrated circuit chip and a semiconductor integrated circuit wafer, in which there is no scar on a bonding pad, which can reduce defects in bonding and increase reliability of connection, and which can downsize the size of a semiconductor chip and prevent power consumption from increasing.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor integrated circuit wafer comprising:
   a plurality of semiconductor integrated circuit regions each of which includes a semiconductor integrated circuit formed thereon;
   a scribe region which separates said semiconductor integrated circuit regions adjacent to each other;
   a build in self test (BIST) circuit which is provided in said scribe region to inspect said semiconductor integrated circuit;
   a connection wiring which is formed ranging from said scribe region to said semiconductor integrated circuit region and connects said semiconductor integrated circuit and said BIST circuit;
   a BIST switching signal input pad which is provided in said semiconductor integrated circuit region; and
   a BIST switching circuit which is provided in said semiconductor integrated circuit region and is driven by a driving signal input from said BIST switching signal input pad, said BIST switching circuit including:
   an input-output pad which connects with said semiconductor integrated circuit through a circuit wiring; and
   a switch element which is provided at a middle position of said circuit wiring and is driven by said driving signal input from said BIST switching signal input pad.

2. The semiconductor integrated circuit wafer according to claim 1, wherein said switch element connects said input-output pad with said semiconductor integrated circuit via said circuit wiring during a turn-off state, and blocks said circuit wiring and connects said BIST circuit with said semiconductor integrated circuit via said connection wiring during a turn-on state caused by said driving signal.

3. A semiconductor integrated circuit chip which is obtained by dividing a semiconductor integrated circuit wafer along a scribe region, said semiconductor integrated circuit chip comprising:
   a semiconductor integrated circuit;
   a build in self test (BIST) switching signal input pad; and
   a BIST switching circuit which is driven by a driving signal input from said BIST switching signal input pad, said BIST switching circuit including:
   an input-output pad which connects with said semiconductor integrated circuit through a circuit wiring; and
   a switch element which is provided at a middle position of said circuit wiring and is driven by said driving signal input from said BIST switching signal input pad.

4. A method of testing a semiconductor integrated circuit included in a semiconductor integrated circuit wafer, said semiconductor integrated circuit wafer including: a plurality of semiconductor integrated circuit regions each formed with said semiconductor integrated circuit; a scribe region which separates said semiconductor integrated circuit regions adjacent to each other; a build in self test (BIST) circuit which is provided in said scribe region; a connection wiring which connects said semiconductor integrated circuit and said BIST circuit; a BIST switching signal input pad which is provided in said semiconductor integrated circuit region, said BIST switching circuit including an input-output pad which connects with said semiconductor integrated circuit through a circuit wiring, and a switch element which is provided at a middle position of said circuit wiring, said method comprising:
   connecting a probe pin of a probe card with said BIST circuit and said BIST switching signal input pad;
   inputting a driving signal to said BIST switching signal input pad to turn on said switch element in said BIST switching circuit so as to disconnect said circuit wiring and connect said BIST circuit with said semiconductor integrated circuit via said connection wiring;
   inputting an information signal to said BIST circuit via said probe pin from a tester; and
   inputting said input information signal to said semiconductor integrated circuit via said connection wiring to inspect said semiconductor integrated circuit.

* * * * *